US006903363B2

(12) United States Patent
Hirohata et al.

(10) Patent No.: US 6,903,363 B2
(45) Date of Patent: Jun. 7, 2005

(54) PHOTOCATHODE

(75) Inventors: Toru Hirohata, Hamamatsu (JP); Minoru Niigaki, Hamamatsu (JP); Tomoko Mochizuki, Hamamatsu (JP); Masami Yamada, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/705,901

(22) Filed: Nov. 13, 2003

(65) Prior Publication Data

US 2004/0094755 A1 May 20, 2004

(30) Foreign Application Priority Data

Nov. 14, 2002 (JP) ..................................... P2002-331142

(51) Int. Cl.[7] .......................... H01L 29/06; H01L 33/00

(52) U.S. Cl. ............................. 257/10; 257/10; 257/99; 257/81

(58) Field of Search ............................... 257/10, 81, 99

(56) References Cited

U.S. PATENT DOCUMENTS 3,958,143 A 5/1976 Bell
5,047,821 A 9/1991 Costello et al.
6,365,949 B1 * 4/2002 Ruiter et al. ................ 257/431

FOREIGN PATENT DOCUMENTS

JP 05-234501 9/1993
JP 09320457 A * 12/1997 ............. H01J/1/34
JP 2923462 B 4/1999

* cited by examiner

*Primary Examiner*—Allan R. Wilson
*Assistant Examiner*—Joseph Nguyen
(74) *Attorney, Agent, or Firm*—Morgan, Lewis & Bockius LLP

(57) ABSTRACT

The invention relates to a photocathode having a structure that permits a decrease in the radiant sensitivity at low temperatures is suppressed so that the S/N ratio is improved. In the photocathode, a light absorbing layer is formed on the upper layer of a substrate. An electron emitting layer is formed on the upper layer of the light absorbing layer. A contact layer having a striped-shape is formed on the upper layer of the electron emitting layer. A surface electrode composed of metal is formed on the surface of the contact layer. The interval between bars in the contact layer is adjusted so as to become 0.2 μm or more but 2 μm or less.

1 Claim, 7 Drawing Sheets

Fig.6

| BIAS VOLTAGE (V) | SAMPLE1 AT SPACING OF 4 μm | SAMPLE2 AT SPACING OF 2.5 μm | SAMPLE3 AT SPACING OF 2.5 μm | SAMPLE4 AT SPACING OF 1.8 μm | SAMPLE5 AT SPACING OF 1.8 μm | SAMPLE6 AT SPACING OF 1.4 μm | SAMPLE7 AT SPACING OF 1.4 μm |
|---|---|---|---|---|---|---|---|
| 0.5 | | | | | | | |
| 1 | | | | | | | |
| 1.5 | | | 0.00E+00 | | | | |
| 2 | | 0.00E+00 | 0.00E+00 | | | | 0.00E+00 |
| 2.5 | | 1.33E-02 | 0.00E+00 | 0.00E+00 | | 0.00E+00 | 2.40E-03 |
| 3 | 0.00E+00 | 3.11E-03 | 0.00E+00 | 1.97E-03 | 0.00E+00 | 1.19E-02 | 1.61E-03 |
| 3.5 | 2.94E-06 | 3.08E-04 | 0.00E+00 | 8.33E-04 | 8.59E-02 | 1.44E-01 | 3.14E-03 |
| 4 | 3.45E-06 | 1.62E-04 | 6.99E-06 | 6.67E-04 | 6.87E-02 | 5.28E-01 | 4.31E-02 |
| 4.5 | 2.83E-05 | 2.57E-04 | 1.69E-05 | 5.63E-03 | 1.52E-01 | 6.74E-01 | 4.40E-01 |
| 5 | 3.03E-04 | 8.83E-04 | 5.43E-05 | 7.24E-02 | 3.48E-01 | 5.45E-01 | 1.05E+00 |
| 5.5 | 1.42E-02 | 6.46E-03 | 7.20E-04 | 3.35E-01 | 4.20E-01 | 7.59E-01 | 1.17E+00 |
| 6 | 1.54E-02 | 7.13E-02 | 3.19E-02 | 4.75E-01 | 7.90E-01 | 1.10E+00 | 1.14E+00 |
| 6.5 | 1.23E-02 | 2.08E-01 | 2.46E-02 | 7.09E-01 | 7.75E-01 | 1.17E+00 | 1.05E+00 |
| 7 | 1.24E-02 | 1.87E-01 | 2.40E-02 | 6.97E-01 | 7.85E-01 | 1.11E+00 | 9.17E-01 |
| 7.5 | 1.87E-02 | 2.38E-01 | 3.60E-02 | 7.43E-01 | 7.31E-01 | 1.01E+00 | 9.00E-01 |
| 8 | 2.01E-02 | 3.26E-01 | 9.25E-02 | 7.62E-01 | 7.60E-01 | 8.78E-01 | 8.92E-01 |
| 8.5 | 2.72E-02 | 4.11E-01 | 2.30E-01 | 7.88E-01 | 7.69E-01 | 8.31E-01 | 9.08E-01 |
| 9 | 4.37E-02 | 4.89E-01 | 4.38E-01 | 8.17E-01 | 8.31E-01 | 8.31E-01 | 9.97E-01 |
| 9.5 | 6.32E-02 | 5.47E-01 | 5.09E-01 | 9.08E-01 | 8.20E-01 | 8.03E-01 | |
| 10 | 1.11E-01 | 5.95E-01 | 5.67E-01 | 8.93E-01 | 8.46E-01 | 7.72E-01 | |

*Fig.8*

| ELECTRODE SPACING 2L($\mu$m) | bias(V) | bias(V)/2L | W(m) | R(m) | R/W |
|---|---|---|---|---|---|
| 1.4 | 3.4 | 2.43E+00 | 8.06E-07 | 9.90E-07 | 1.23E+00 |
| 1.4 | 4.1 | 2.93E+00 | 8.64E-07 | 9.90E-07 | 1.15E+00 |
| 1.8 | 4.3 | 2.39E+00 | 8.80E-07 | 1.14E-06 | 1.30E+00 |
| 1.8 | 5.1 | 2.83E+00 | 9.41E-07 | 1.14E-06 | 1.21E+00 |
| 2.5 | 8.1 | 3.24E+00 | 1.14E-06 | 1.43E-06 | 1.26E+00 |

PHOTOCATHODE

BACKGROUND OF THE INVENTION

1. Field of the Invention

The present invention relates to a photocathode (photoelectron emitting surface) for emitting photoelectrons in response to photon incidence.

2. Related Background Art

A photocathode comprising a light absorbing layer and an electron emitting layer provided on a semiconductor, and means for applying an electric field between these light absorbing layer and electron emitting layer is disclosed, for example, in Japanese Patent No. 2923462 (Reference 1). This photocathode comprises a substrate composed of InP. A light absorbing layer composed of InGaAs having a thickness of 2 $\mu$m is formed on the upper layer of the substrate, while a p-type InP electron emitting layer having a thickness of 0.7 $\mu$m is formed on the light absorbing layer. Further, a mesh-shaped electrode comprising an n-type InP layer and a Ti metal layer for providing a potential to this n-type InP layer is formed on the p-type InP electron emitting layer.

A p-n junction is formed between the n-type InP layer and the p-type InP electron emitting layer and between the latter layer and the light absorbing layer. An electric field is applied between the light absorbing layer and the electron emitting layer by an electric power supply, a wiring, and an electrode composed of AuZn. In this photocathode, the mesh electrode has a width of 2 $\mu$m and an electrode spacing of 4 $\mu$m. Cesium oxide is applied to the exposed part of the surface of the p-type InP electron emitting layer, so as to reduce the work function of the surface of the p-type InP electron emitting layer. The photocathode is sealed in vacuum, and accommodated in a vessel having a light incident window. Further, electrons emitted from the photocathode reach a collector electrode provided.

SUMMARY OF THE INVENTION

The inventors have studied conventional photocathodes in detail and, and as a result, have found problems as follows. Namely, in the conventional photocathodes, it is desired to implement a good radiant sensitivity (photoelectric sensitivity) and, at the same time, prevent degradation in the signal to noise ratio S/N. Nevertheless, the photocathode disclosed in the Reference 1 has a problem at low temperatures. In general, since dark electron emission from a photoelectron emitting surface is dominated by thermal electron emission, a reduction in the temperature of the photocathode could improve the S/N ratio.

Nevertheless, the reduction in the temperature of the photocathode causes a decrease in the radiant sensitivity. FIG. 1 is a graph showing the temperature change of the radiant sensitivity of a conventional photocathode. In FIG. 1, the curve G100 indicates a radiant sensitivity at −100° C., the curve G110 indicates a radiant sensitivity at −80° C., the curve G120 indicates a radiant sensitivity at −120° C., the curve G130 indicates a radiant sensitivity at −140° C., and the curve G140 indicates a radiant sensitivity at −160° C. As can be seen from FIG. 1, with a decreasing temperature of the photocathode, the radiant sensitivity of the photocathode decreases rapidly starting from the longer wavelength side. That is, the reduction in the temperature of the photocathode causes a decrease in the radiant sensitivity and this places a limit on the cooling of the photocathode, and hence prevents the improvement of the S/N ratio wherein this has been a problem.

The invention has been devised in order to resolve the above-mentioned problem. An object of the invention is to provide a photocathode in which the decrease in the radiant sensitivity at low temperatures is suppressed so that the S/N ratio is improved.

In order to resolve the above-mentioned problem, the present inventors have devoted considerable research efforts, and conducted the later-described experiments by adjusting various parameters of the photocathode. As a result, the inventors have found such ranges of predetermined parameters that when these predetermined parameters of the photocathode are set within these ranges, the decrease in the radiant sensitivity is suppressed even at low temperatures. This has lead to completion of the invention.

A photocathode according to the present invention is a photocathode for emitting electrons in response to incident light, comprising a semiconductor substrate of a first conductive type, a first semiconductor layer of the first conductive type, a second semiconductor layer of the first conductive type, a third semiconductor layer of a second conductive type, a surface electrode, an active layer, a backside electrode. The semiconductor substrate has a first surface and a second surface opposing the first surface. The first semiconductor layer is provided on the first surface of the semiconductor substrate. The second semiconductor layer is also provided on the first surface of the semiconductor layer. The third semiconductor layer is provided on the second semiconductor layer and has a shape such that a part in the surface of the second semiconductor layer is exposed. The surface electrode is provided on the third semiconductor layer. The active layer functions so as to reduce the work function of the second semiconductor layer, and is provided on the exposed part in the surface of the second semiconductor layer. The backside electrode is provided on the second surface of the semiconductor substrate. In particular, in the photocathode, a minimum interval 2L between parts of the third semiconductor layer, facing each other while sandwiching the exposed part of the surface of the second semiconductor layer, is 0.2 $\mu$m (=$0.2\times10^{-6}$ m) or more but 2 $\mu$m (=$2\times10^{-6}$m) or less. In other words, the minimum distance L from the third semiconductor layer to the center of the exposed part in the surface of the second semiconductor layer preferably becomes 0.1 $\mu$m (=$0.1\times10^{-6}$ m) or more but 1 $\mu$m (=$1\times10^{-6}$ m) or less.

As described above, in the photocathode according to the present invention, the minimum interval 2L between the parts of the third semiconductor layer, facing each other while sandwiching the exposed part in the surface of the second semiconductor layer is set to 0.2 $\mu$m or more but 2 $\mu$m or less. This permits suppression of a decrease in the radiant sensitivity at low temperatures, as described later in the description of the experiments of the embodiments of the present invention. Accordingly, even when the photocathode is cooled down so that the temperature is reduced, a decrease in the radiant sensitivity is substantially avoided. This permits improvement of the S/N ratio of the photocathode.

The present invention may be implemented in a such a manner that the value of the voltage V applied between the surface electrode and the backside electrode divided by the minimum interval 2L between the parts of the third semiconductor layer, facing each other while sandwiching the exposed part of the surface of the second semiconductor layer is 2 (V/$\mu$m) or more. In other words, the value of V/L is 4 (V/$\mu$m) or more.

The present invention may be implemented in a such a manner that the thickness D (m) of the second semiconductor layer, the minimum interval 2L (m) between the parts of the third semiconductor layer, facing each other while sandwiching the exposed part in the surface of the second semiconductor layer, the carrier density N ($m^3$) of the second semiconductor layer, and the voltage V (V) applied between the surface electrode and the backside electrode satisfy the following relationship (1):

$$D^2+L^2 \leqq 3.0(1+V)\times 10^9/N \quad (1).$$

The present invention may be implemented in a such a manner that the thickness D (m) of the second semiconductor layer, the minimum interval 2L (m) between the parts of the third semiconductor layer, facing each other while sandwiching the exposed part in the surface of the second semiconductor layer, and the voltage V (V) applied between the surface electrode and the backside electrode satisfy the following relationship (2):

$$D^2+L^2 \leqq 6.0(1+V)\times 10^{-13} \quad (2).$$

The present invention may be implemented in a such a manner that the minimum interval 2L (m) between the parts of the third semiconductor layer, facing each other while sandwiching the exposed part in the surface of the second semiconductor layer, the carrier density N ($m^3$) of the second semiconductor layer, and the voltage V (V) applied between the surface electrode and the backside electrode satisfy the following relationship (3):

$$L^2 \leqq 3.0(1+V)\times 10^9/N \quad (3).$$

The present invention may be implemented in a such a manner that the minimum interval 2L (m) between the parts of the third semiconductor layer, facing each other while sandwiching the exposed part in the surface of the second semiconductor layer, and the voltage V (V) applied between the surface electrode and the backside electrode satisfy the following relationship (4):

$$L^2 \leqq 6.0(1+V)\times 10^{-13} \quad (4).$$

The present invention may be implemented in a such a manner that the thickness D (m) of the second semiconductor layer, the minimum interval 2L (m) between the parts of the third semiconductor layer, facing each other while sandwiching the exposed part in the surface of the second semiconductor layer, and the carrier density N ($m^3$) of the second semiconductor layer satisfy the following relationship (5):

$$D^2+L^2 \leqq 3.3\times 10^{10}/N \quad (5).$$

The present invention may be implemented in a such a manner that the thickness D (m) of the second semiconductor layer, and the minimum interval 2L (m) between the parts of the third semiconductor layer, facing each other while sandwiching the exposed part in the surface of the second semiconductor layer satisfy the following relationship (6):

$$D^2+L^2 \leqq 6.6\times 10^{-12} \quad (6).$$

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 6 is a table listing the ratio of the sensitivity at −80° C. with respect to the sensitivity at −160° C. of the prepared samples at the wavelength of 1500 nm;

FIG. 8 is a table listing the relationship between electrode spacing and the bias voltage.

DETAILED DESCRIPTION OF THE PREFERRED EMBODIMENTS

Embodiments of the invention are described below in detail with reference to FIGS. 2–9.

Figure 1:
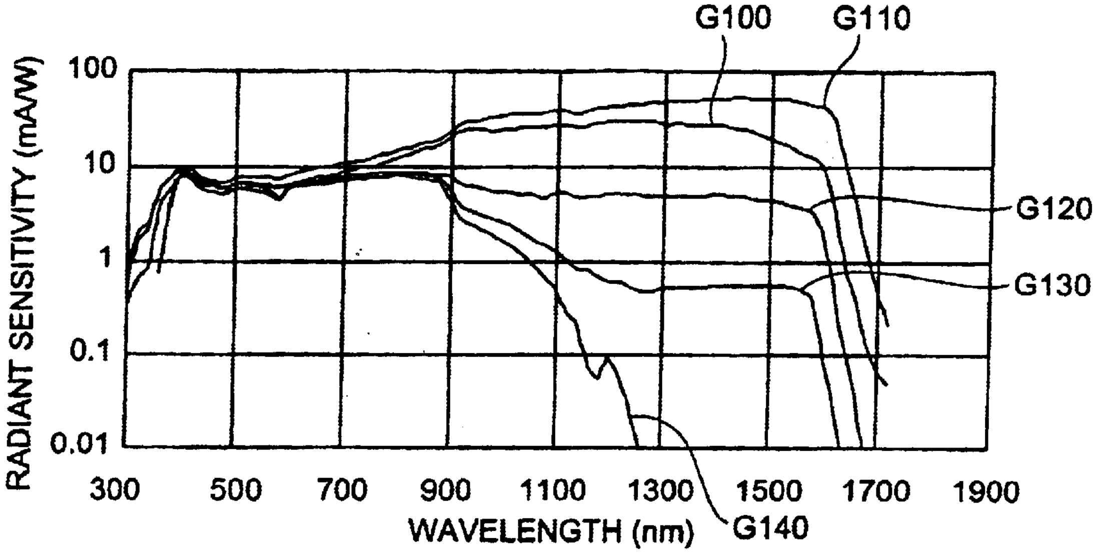
Fig.1 PRIOR ART
FIG. 1 is a graph showing the temperature change in the radiant sensitivity (photoelectric sensitivity) of a conventional photocathode.
Figure 2:
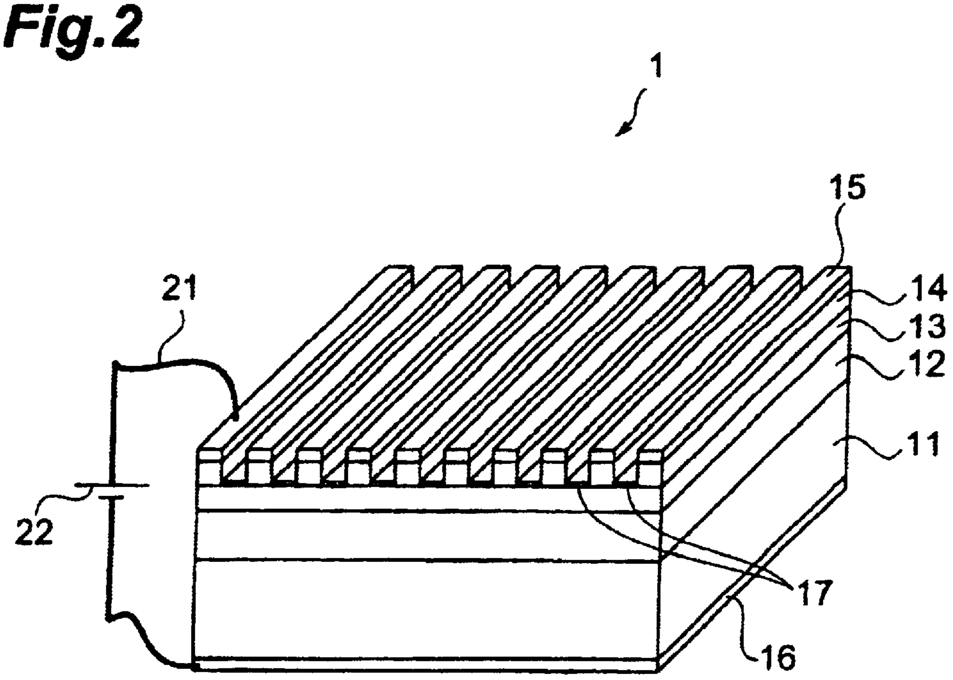
FIG. 2 is a perspective view of an entire photocathode according to an embodiment of the present invention.
Figure 3:
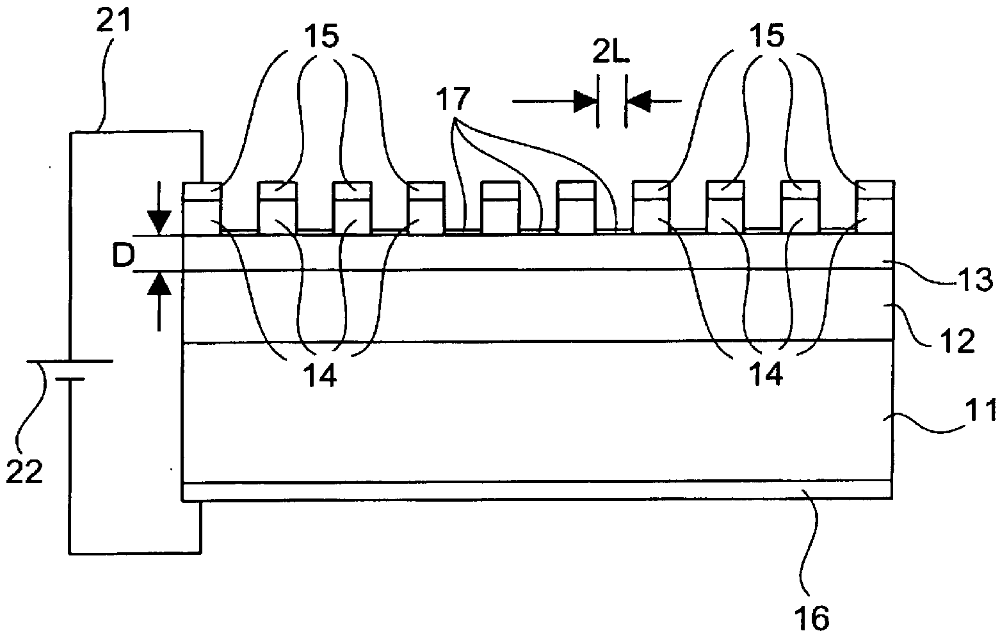
FIG. 3 is a cross sectional view of the photocathode shown in FIG. 2.

FIG. 2 is an entire perspective view of an embodiment of a photocathode according to the present invention, and FIG. 3 is a cross sectional view on the photocathode shown in FIG. 2.

As shown in FIG. 2, a photocathode 1 according to the present embodiment comprises a substrate 11 composed of p-type InP and having a carrier density of $10^{18}$ $cm^{-3}$ or higher. A light absorbing layer 12 is formed on the upper layer of the substrate 11. The light absorbing layer 12 is composed of p-type InGaAs and has a carrier density of $10^{16}$ $cm^{-3}$ and a thickness of 2 μm.

An electron emitting layer 13 for accelerating photoelectrons towards the emitting surface is formed on the upper layer of the light absorbing layer 12. The electron emitting layer 13 is composed of p-type InP and has a carrier density of $10^{16}$ $cm^{-3}$ and a thickness of 0.7 μm. A contact layer 14 is formed on the upper layer of the electron emitting layer 13. The contact layer 14 is stripe-shaped such that a plurality of bars are arranged in parallel. The width of a bar (line width) is 1.4 μm, while the interval between the bars (line space) is 1.4 μm. A surface electrode 15 composed of Ti is formed on the surface of the contact layer 14. The surface electrode 15 has a thickness of 0.03 μm.

A part of the electron emitting layer 13 is exposed through the space between the stripe-shaped contact layer 14. The contact layer 14 is formed stripe-shaped by patterning using lithography. The surface of the electron emitting layer 13 exposed through the space between the bars of the contact layer 14 is covered by an active layer 17 composed of cesium oxide, so that the work function is reduced. A backside electrode 16 composed of AuZn and having a thickness of 0.03 μm is formed on the back surface of the substrate 11.

The surface electrode 15 and the backside electrode 16 are connected respectively through wirings 21 and 21 each composed of a contact wire to a power supply 22, so that a bias voltage V of 5 V or the like is applied between these electrodes 15 and 16. FIG. 2 shows as if the surface electrode 15 is connected directly to the wiring 21. However, in actual configuration, the surface electrode 15 has a portion expanded into a diameter of about 1 mm, so that the wiring 21 is connected to this portion. The potential V is distributed to all of the stripe-shaped surface electrode 15.

In the photocathode 1 according to the present embodiment having the above-mentioned configuration, the light having passed through the electron emitting layer 13 and incident on the light absorbing layer 12 is absorbed in the light absorbing layer 12 and then generates photoelectrons. Since a p-n junction is formed between the light absorbing layer 12 and the electron emitting layer 13 and between the electron emitting layer 13 and the contact layer 14, the electric field generated by the bias voltage applied between the electrodes transports the photoelectrons into the electron emitting layer 13, so that the photoelectrons are emitted into vacuum from the surface of the electron emitting layer 13 whereby the work function is reduced by the active layer 17.

In the photocathode 1, in order to broaden out the region having a strong electric field, the carrier density of the electron emitting layer 13 is set sufficiently lower than that of the contact layer 14. Thus, the electric resistance of the electron emitting layer 13 is high. When the temperature of the photocathode 1 is lowered, the electric resistance of the electron emitting layer 13 increases further. When electrons are emitted from the surface of the electron emitting layer 13, not all the electrons are emitted. The probability that the electron is emitted is approximately 1/10. The electrons not emitted and hence having remained in the electron emitting layer 13 are led through the exposed surface of the electron emitting layer 13 to the contact layer 14 and the surface electrode 15, so as to be discharged. Nevertheless, if the electrons remain and stay in the electron emitting layer 13, the electron emission from the electron emitting layer 13 is suppressed, so that the photoelectron radiant sensitivity decreases. In order to avoid a decrease in the radiant sensitivity, the photoelectrons not having been emitted need to be led easily to the contact layer 14.

Regarding this point, in the photocathode 1 according to the present embodiment, the line interval of the stripe-shaped contact layer 14 formed on the upper layer of the electron emitting layer 13 is set to be 1.4 μm. Therefore, the minimum interval between the center of the exposed surface of the photocathode 1 and parts of the contact layer 14, facing each other so as to sandwiching the exposed surface, is 0.7 μm. And hence, the intervale between an arbitrary point on the exposed surface of the photocathode 1 and the contact layer 14 is as short as 0.7 μm or less. By virtue of this, even when the temperature of the photocathode 1 is reduced, the photoelectrons not having been emitted from the electron emitting layer 13 are led easily to the contact layer 14. This advantageously prevents the photoelectrons from remaining in the electron emitting layer 13, and hence prevents a decrease in the radiant sensitivity.

As such, even when the temperature of the photocathode 1 is reduced, a decrease in the radiant sensitivity is prevented. Accordingly, by reducing the temperature of the photocathode 1, the S/N ratio can be improved without a decrease in the radiant sensitivity.

As further research into the present embodiment, the inventors have conducted experiments so as to find conditions such that no decrease in the radiant sensitivity occurs even when the temperature of the photocathode is reduced as described above in the present embodiment. Details of the experiments will be described below.

(Sample)

Samples prepared as a photocathode according to the present invention will be described below. The inventors have conducted the following experiments so as to find conditions such that no decrease in the radiant sensitivity occurs even when the temperature of the photocathode is reduced.

Figure 4:
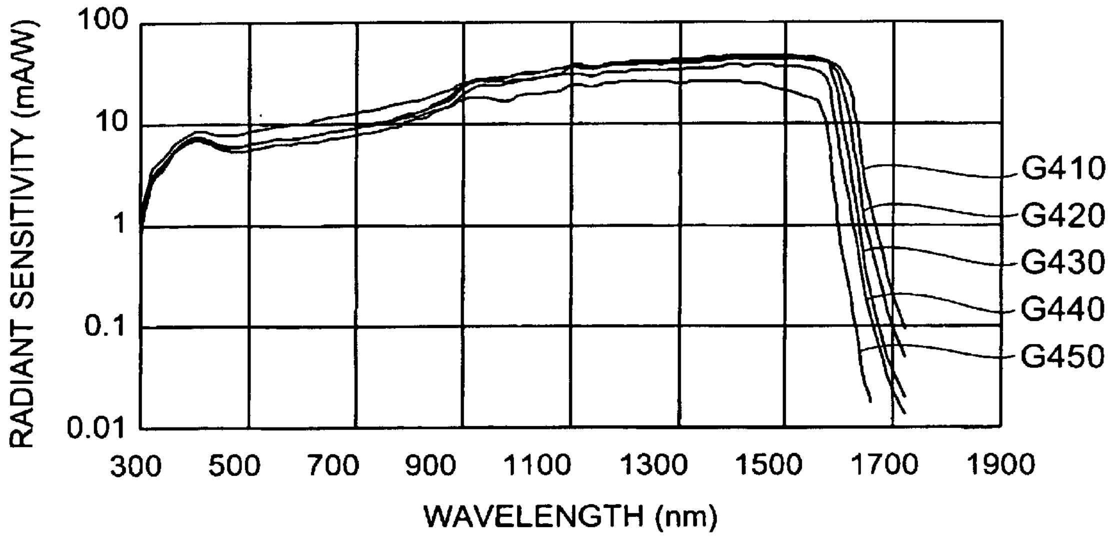
FIG. 4 is a graph showing the temperature change in the radiant sensitivity (photoelectric sensitivity) of a photocathode according to the present invention.

Fabricated were photocathode samples in each of which the interval 2L (electrode spacing) between the bars in the stripe-shaped contact layer was set to be 4.0 μm, 2.5 μm, 1.8 μm, or 1.4 μm. The temperature change in the radiant sensitivity (photoelectric sensitivity) of the photocathode sample of 1.4 μm among these photocathode samples is shown in FIG. 4. In FIG. 4, the curve G410 indicates the radiant sensitivity at −80° C., the curve G420 indicates the radiant sensitivity at −100° C., the curve G430 indicates the radiant sensitivity at −120° C., the curve G440 indicates the radiant sensitivity at −140° C., and the curve G450 indicates the radiant sensitivity at −160° C. As can be seen from FIG. 4, in the sensitivity near the long wavelength limit, for example, near 1500 nm, sensitivity at −160° C. did not greatly decrease in comparison with that at −80° C. This indicates that the sensitivity decrease at low temperatures is improved in comparison with the above-mentioned case where the interval 2L between the bars in the contact layer is 4.0 μm.

Figure 5:
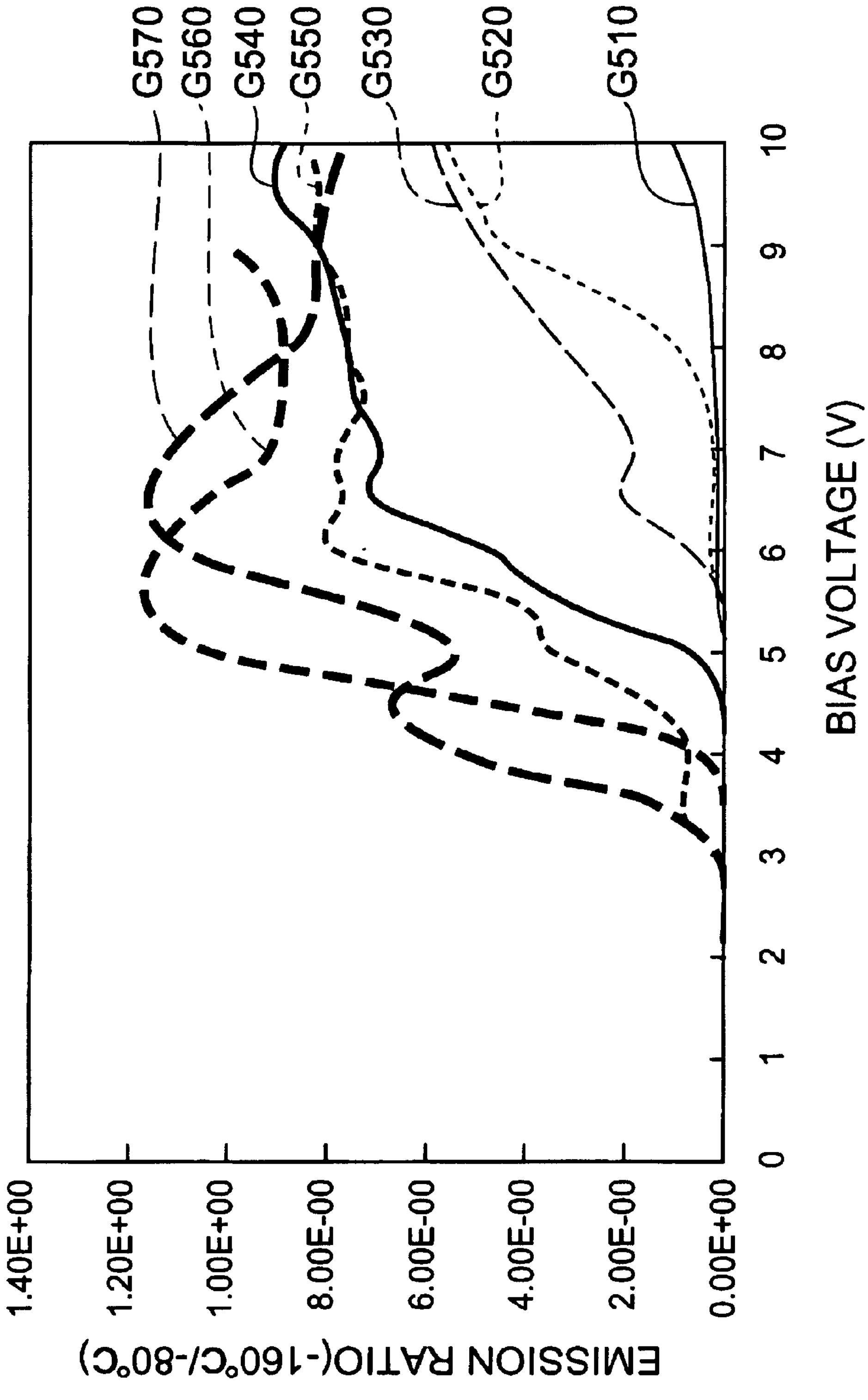
FIG. 5 is a graph showing the voltage applied to a photocathode and the ratio of photoelectron emission sensitivities (sensitivity at −160° C./sensitivity at −80° C.)

Next, the sensitivity at −160° C. was compared with that at −80° C. at a wavelength of 1500 nm for the photocathode samples each comprising a contact layer having one of the above-mentioned distance 2L values. The result, that is, the sensitivity at −160° C. relative to that at −80° C., is shown in FIGS. 5 and 6. Here, FIG. 5 is a graph showing the voltage applied to a photocathode and the ratio of photoelectron emission sensitivities (sensitivity at −160° C./sensitivity at −80° C.), and FIG. 6 is a table listing the ratio of the sensitivity at −80° C. with respect to the sensitivity at −160° C. of the prepared samples 1 to 7 at the wavelength of 1500 nm. In FIG. 5, the curve G510 indicates the emission ratio of sample 1 with the electrode spacing of 4 μm listed in FIG. 6, the curve G520 indicates the emission ratio of sample 2 with the electrode spacing of 2.5 μm listed in FIG. 6, the curve G530 indicates the emission ratio of sample 3 with the electrode spacing of 2.5 μm listed in FIG. 6, the curve G540 indicates the emission ratio of sample 4 with the electrode spacing of 1.8 μm listed in FIG. 6, the curve G550 indicates the emission ratio of sample 5 with the electrode spacing of 1.8 μm listed in FIG. 6, the curve G560 indicates the emission ratio of sample 6 with the electrode spacing of 1.4 μm listed in FIG. 6, and the curve G570 indicates the emission ratio of sample 7 with the electrode spacing of 1.4 μm listed in FIG. 6. Further, FIG. 6 shows the voltage applied to the photocathode and the photoelectron emission sensitivity ratio (−160° C. sensitivity/−80° C. sensitivity).

Figure 7:
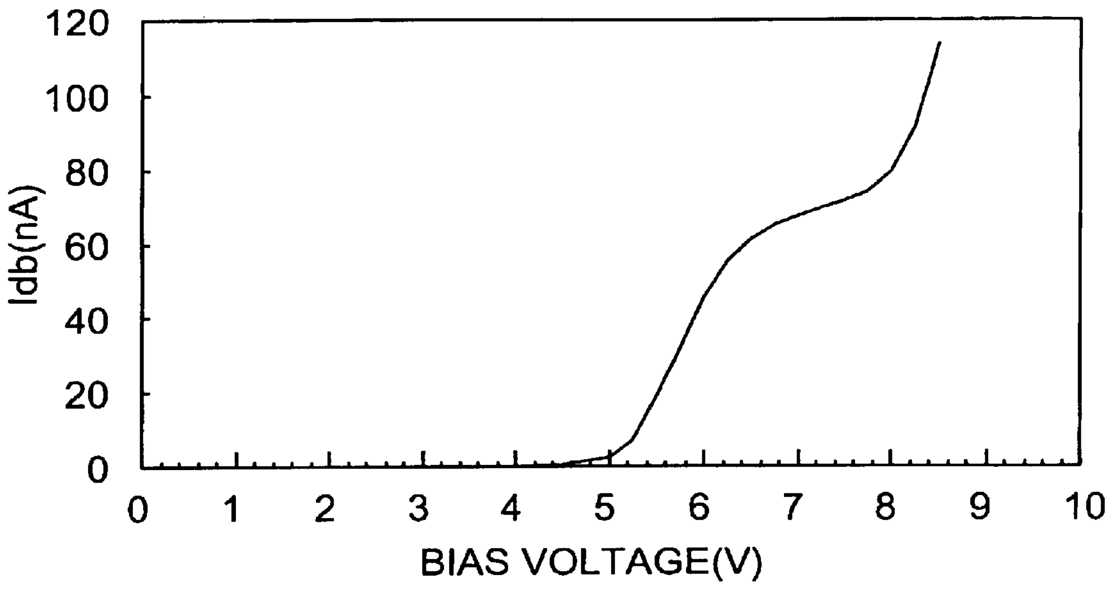
FIG. 7 is a graph showing the relationship between the voltage applied to a photocathode and the dark current.

As can be seen from FIGS. 5 and 6, with decreasing the interval 2L (electrode spacing) between the bars in the contact layer, even a lower crystal-applied bias voltage V permits the sensitivity at −160° C. to reach the level of the sensitivity at −80° C. When the bias voltage V applied to the crystal is increased, the dark current emission increases so as to degrade the S/N ratio as shown in FIG. 7. Accordingly, the voltage application of 8V or more should be avoided. Thus, when the point where the sensitivity at −160° C. becomes 1/10 of that at −80° C. is considered as the limit, the interval 2L between the bars in the contact layer needs to be 2 $\mu$m or less. Further, for simplicity of fabrication of the photocathode, under consideration of precision in semiconductor lithography, the interval 2L between the bars in the contact layer needs to be 0.2 $\mu$m or more. The statement that the interval 2L between the bars is 0.2 $\mu$m or more but 2 $\mu$m or less indicates that the interval L between the center of the exposed surface of the electron emission layer (second semiconductor layer) and the contact layer is 0.1 $\mu$m or more but 1 $\mu$m or less.

Further, when the point where the radiant sensitivity at −160° C. becomes 1/10 of that at −80° C. is considered as the limit, the values of the crystal-applied bias voltage V are as shown in FIG. 8.

When inspecting the ratio of the bias voltage to the interval 2L between the bars in the contact layer shown in FIG. 3, it is found that the relationship "bias voltage (V)/interval 2L ($\mu$m) between the bars ≧2" is the condition where the sensitivity decrease at low temperatures is suppressed without an increase in the dark current. Accordingly, when the value of the voltage V (V) applied inside the photocathode divided by the interval 2L ($\mu$m) between the center of the exposed surface of the electron emission layer (second semiconductor layer) and the contact layer is set to be 4 or more, the sensitivity decrease is avoided in the photocathode.

Here, a reason for causing the sensitivity decrease in the photocathode is discussed below. When the bias voltage is applied to the photocathode, in the crystal, a depletion layer extends from the interface between the inside of the contact layer and the electron emitting layer into the inside of the electron emitting layer and further into the inside of the light absorbing layer. This extension occurs in the vertical direction as well as the horizontal direction. The inside of the depletion layer is in a state similar to vacuum. Thus, photoelectrons in the depletion layer are rapidly transported to the surface. In contrast, in the non-depleted region, electrons are left owing to the high resistance of the semiconductor due to cooling, so as to form a space charge and hence prevent the subsequent photoelectron emission. Accordingly, a certain relationship is expected between the extension of the depletion layer and the sensitivity decrease due to cooling. Thus, using the thickness D (m) of the electron emitting layer 13 and the interval 2L (m) between the bars in the contact layer, a parameter R (m) is defined by the following Equation (1-1):

$$R=(D^2+L^2)^{1/2} \tag{1-1}$$

Also, the extension W (m) of the depletion layer is expressed by the following Equation (1-2) on the basis of solid state physics, using the specific dielectric constant $\in$, the dielectric constant of vacuum $\in_0$ (F/m), the elementary electric charge q (C), the carrier density N ($m^3$), the flat band voltage Vf (V), and the bias voltage V (V):

$$W=(2\in\in_0(Vf+V)/qN)^{1/2} \tag{1-2}.$$

Obtained was the relationship between the parameter R (m) and the extension W (m) of the depletion layer expressed by the above-mentioned Equations (1-1) and (1-2). Here, in Equation (1-2) for obtaining the extension W (m) of the depletion layer, the value of the bias voltage V (V) necessary for causing the radiant sensitivity at −160° C. to reach 1/10 or more of that at −80° C. was used. The result is shown in FIG. 8.

As can be seen from FIG. 8, the relationship of approximately R/W≦1.5 serves as a condition for not causing the sensitivity decrease. The $\in$ is a specific value to the semiconductor material, but equals approximately 12. The flat band voltage Vf (V) is approximately 1 V. As a result, on the basis of Equations (1-1) and (1-2), the condition for not causing the sensitivity decrease is obtained as the following Equation (1):

$$D^2+L^2\leqq 3.0(1+V)\times 10^9/N \tag{1}.$$

A lower carrier density permits even easier extending of the depletion layer. Nevertheless, the carrier density is difficult to be controlled at approximately 5E21 ($m^3$) or less in practice. Thus, the carrier density N=5E21 ($m^3$) may be substituted into Equation (1), so that the following Equation (2) may be used as the condition:

$$D^2+L^2\leqq 6.0(1+V)\times 10^{-13} \tag{2}.$$

Further, the thickness D (m) of the electron emitting layer 13 may be assumed to approach limitless zero. Even in this case, the condition for not causing the sensitivity decrease is satisfied. Thus, the thickness D=0 ($10^{-6}$ m) of the electron emitting layer 13 may be substituted into Equation (1), so that the following Equation (3) may be used as the condition:

$$L^2\leqq 3.0(1+V)\times 10^9/N \tag{3}.$$

Also in this case, the limitation in the carrier density N ($m^3$) maybe taken into account. That is, the carrier density N=5E21 ($m^3$) may be substituted into Equation (3), so that the following Equation (4) may be used as the condition:

$$L^2\leqq 6.0(1+V)\times 10^{-13} \tag{4}.$$

An excessively high bias voltage V (V) applied to the crystal causes an increase in the dark current, and disables usage. Thus, a bias voltage V=10 (V) may be considered as the upper limit. Using this limit, substituting V=10 (V) into Equation (1), the following Equation (5) may be used as the condition:

$$D^2+L^2\leqq 3.3\times 10^{10}/N \tag{5}$$

Also in this case, the limitation in the carrier density N may be taken into account. That is, the carrier density N=5E21 ($m^3$) may be substituted into Equation (5), so that the following Equation (6) may be used as the condition:

$$D^2+L^2\leqq 6.6\times 10^{-12} \tag{6}.$$

Figure 9:
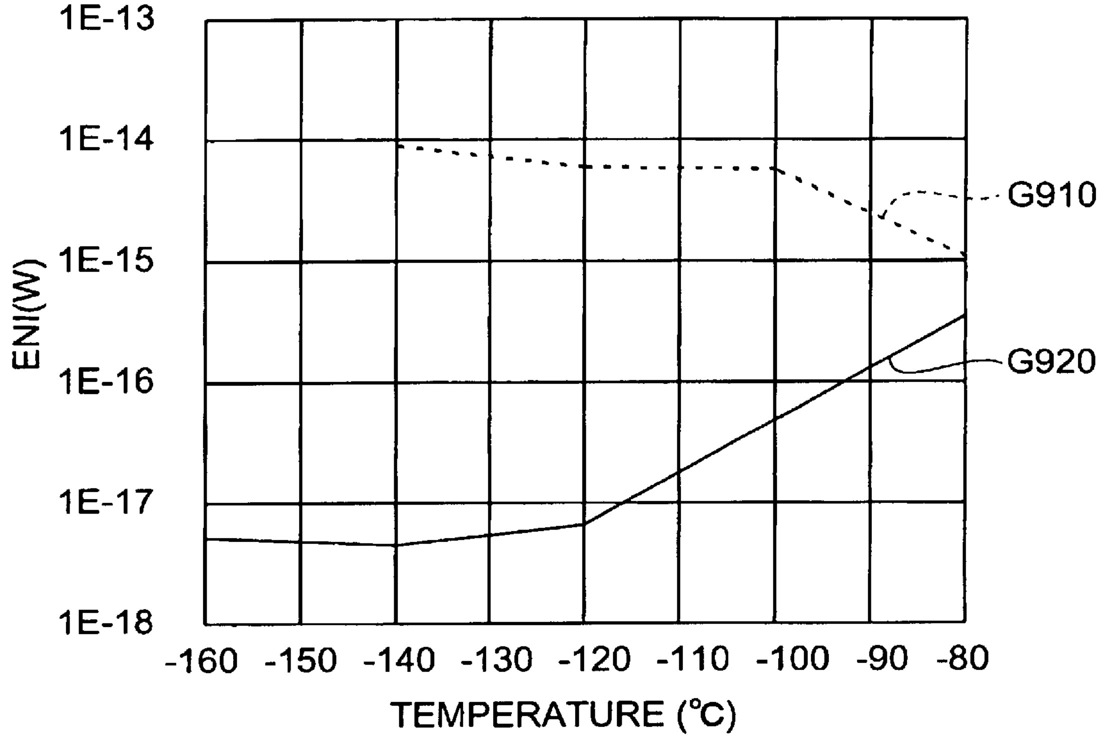
FIG. 9 is a graph showing the comparative result of the minimum detection optical powers, as a function of the temperature of a photocathode, obtained in photomultipliers each provided with a conventional photocathode or a photocathode according to the present invention.

When the photocathode is fabricated such that any one of the conditions (1)–(6) is satisfied, the cooling of the photocathode permits the suppression of thermal electron emission and hence the improvement of S/N ratio without a decrease in the radiant sensitivity of the photocathode. This permits the detection of even weaker light. FIG. 9 shows the result of comparison of the minimum detection optical power as a function of the temperature of the photocathode, obtained in photomultipliers each provided with a prior art photocathode (shown as the curve G910) or a photocathode according to the present invention (shown as the curve G920). As can be seen from FIG. 9, the photocathode according to the present invention greatly improves the detection performance.

Preferred embodiments of the invention have been described above. However, the invention is not limited to these embodiments. For example, the description of the embodiments has been made for a case where the contact layer is formed stripe-shaped. However, the contact layer may be mesh (lattice) shaped or a spiral-shaped.

Further, the description of the embodiments has been made for a case where the material of the photocathode is an InP/InGaAs compound semiconductor. However, in addition to an InP/InGaAsP compound semiconductor, the material may be: CdTe, GaSb, InP, GaAsP, GaAlAsSb, or InGaAsSb as disclosed in U.S. Pat. No. 3,958,143; a hetero-structure formed by combining some of these materials; a hetero-structure composed of Ge/GaAs, Si/GaP, or GaAs/InGaAs; or a semiconductor multi-film material such as a GaAs/AlGaAs multi-film disclosed in Japanese Patent Laid-Open No. Hei-5-234501.

Further, the description of the embodiments has been made for a case where the surface electrode and the backside electrode are composed of a AuGe/Ni/Au alloy material. However, the invention is not limited to this. Any material permitting good electrical ohmic contact with the semiconductor base may be used. Even when the photoelectron emitting surface is formed using such a material, an effect similar to that of the above-mentioned embodiments is obtained.

As described above, in accordance with the present invention, a decrease in the radiant sensitivity at low temperatures can be suppressed such that the S/N ratio is improved.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A photocathode for emitting electrons in response to incident light, comprising:

a semiconductor substrate of a first conductive type, said semiconductor substrate having a first surface and a second surface opposing the first surface;

a first semiconductor layer of the first conductive type provided on the first surface of said semiconductor substrate;

a second semiconductor layer of the first conductive type provided on said first semiconductor layer;

a third semiconductor layer of a second conductive type provided on said second semiconductor layer, said third semiconductor layer having a shape such that a part in the surface of said second semiconductor layer is exposed;

a surface electrode provided on said third semiconductor layer;

an active layer, for reducing the work function of said second semiconductor layer, provided on the exposed part in the surface of said second semiconductor layer; and a backside electrode provided on the second surface of said semiconductor substrate, wherein a minimum interval 2L between parts of said third semiconductor layer, facing each other while sandwiching the exposed part in the surface of the second semiconductor layer, is 0.2 $\mu$m or more but 2 $\mu$m or less.

* * * * *